United States Patent
Kaeding

(10) Patent No.: US 11,114,383 B2
(45) Date of Patent: Sep. 7, 2021

(54) SEMICONDUCTOR DEVICES HAVING INTEGRATED OPTICAL COMPONENTS

(71) Applicant: Micron Technology, Inc., Boise, ID (US)

(72) Inventor: John F. Kaeding, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/168,652

(22) Filed: Oct. 23, 2018

(65) Prior Publication Data

US 2020/0126917 A1    Apr. 23, 2020

(51) Int. Cl.
| | |
|---|---|
| *H01L 23/538* | (2006.01) |
| *H01L 25/18* | (2006.01) |
| *H01L 25/16* | (2006.01) |
| *H01L 23/31* | (2006.01) |
| *H01L 25/065* | (2006.01) |
| *H01L 27/146* | (2006.01) |

(Continued)

(52) U.S. Cl.
CPC ........... *H01L 23/5384* (2013.01); *G02B 6/12* (2013.01); *G02B 6/4202* (2013.01); *H01L 23/3128* (2013.01); *H01L 24/09* (2013.01); *H01L 24/17* (2013.01); *H01L 24/32* (2013.01); *H01L 25/167* (2013.01); *H01L 25/18* (2013.01); *H01L 2224/0401* (2013.01); *H01L 2225/06555* (2013.01); *H01L 2924/12042* (2013.01); *H01L 2924/12043* (2013.01)

(58) Field of Classification Search
CPC .......................... H01L 25/167; H01L 23/5384
See application file for complete search history.

(56) References Cited

U.S. PATENT DOCUMENTS

| | | | | |
|---|---|---|---|---|
| 2006/0177173 | A1* | 8/2006 | Shastri | G02F 1/025 |
| | | | | 385/14 |
| 2009/0297091 | A1* | 12/2009 | Assefa | H01L 27/0688 |
| | | | | 385/14 |

(Continued)

FOREIGN PATENT DOCUMENTS

| | | |
|---|---|---|
| CN | 101996898 A | 3/2011 |
| CN | 101996899 A | 3/2011 |

(Continued)

OTHER PUBLICATIONS

CN Patent Application No. 201910994488.7—Chinese Office Action and Search Report, dated May 24, 2021, with English Translation, 22 pages.

*Primary Examiner* — Omar F Mojaddedi
(74) *Attorney, Agent, or Firm* — Perkins Coie LLP

(57) ABSTRACT

Semiconductor devices having optical routing layers, and associated systems and methods, are disclosed herein. In one embodiment, a method of manufacturing a semiconductor device includes forming conductive pads on a first side of a substrate and electrically coupled to conductive material of vias extending partially through the substrate. The method further includes removing material from a second side of the substrate so that the conductive material of the vias projects beyond the second side of the substrate to define projecting portions of the conductive material. The method also includes forming an optical routing layer on the second side of the substrate and at least partially around the projecting portions of the conductive material.

22 Claims, 13 Drawing Sheets

(51) Int. Cl.
*G02B 6/12* (2006.01)
*G02B 6/42* (2006.01)
*H01L 23/498* (2006.01)
*H01L 23/48* (2006.01)
*G02B 6/43* (2006.01)
*G02F 1/025* (2006.01)
*H01L 27/12* (2006.01)
*H01L 23/00* (2006.01)

(56) References Cited

U.S. PATENT DOCUMENTS

| | | | | |
|---|---|---|---|---|
| 2011/0165730 | A1* | 7/2011 | Ohba | H01L 25/50 438/107 |
| 2014/0269804 | A1* | 9/2014 | Lai | G02B 6/13 372/50.21 |
| 2017/0115458 | A1 | 4/2017 | Mekis et al. | |
| 2019/0123231 | A1* | 4/2019 | Furuyama | G02B 6/13 |

FOREIGN PATENT DOCUMENTS

| | | |
|---|---|---|
| CN | 102859680 A | 1/2013 |
| CN | 103000648 A | 3/2013 |
| CN | 104051286 A | 9/2014 |
| CN | 107040318 A | 8/2017 |

\* cited by examiner

SEMICONDUCTOR DEVICES HAVING INTEGRATED OPTICAL COMPONENTS

TECHNICAL FIELD

The present technology generally relates to semiconductor devices having integrated optical components, and more particularly relates to semiconductor dies having optical routing layers formed thereon.

BACKGROUND

Packaged semiconductor dies, including memory chips, microprocessor chips, and imager chips, typically include a semiconductor die mounted on a substrate and encased in a protective covering. The semiconductor die includes functional features, such as memory cells, processor circuits, and imager devices, as well as bond pads electrically connected to the functional features. The bond pads can be electrically connected to terminals outside the protective covering to allow the semiconductor die to be connected to higher level circuitry.

In some instances, a semiconductor die package can be electrically coupled to various optical components (e.g., transmitters, receivers, etc.) for converting electrical signals to/from the semiconductor die(s) in the package to optical signals that can be, for example, routed to external devices at higher speeds and/or bandwidths than electrical signals. Such optical components are typically discrete components that are located externally to the semiconductor die package. For example, discrete optical components can be integrated in a side-by-side fashion with the semiconductor die package on an interposer and electrically coupled to the semiconductor die package via conductive lines, traces, etc., to form an electro-optical semiconductor die assembly. Such electro-optical semiconductor die assemblies can be relatively large and, at high data bandwidths, the electrical signals in the conductive lines, traces, etc., can only propagate for small distances until additional repeater chips are needed to boost the signals. Such repeater chips consume additional power-increasing the cost and complexity of operating an electro-optical semiconductor die assembly.

BRIEF DESCRIPTION OF THE DRAWINGS

Many aspects of the present technology can be better understood with reference to the following drawings. The components in the drawings are not necessarily to scale. Instead, emphasis is placed on illustrating clearly the principles of the present technology.

DETAILED DESCRIPTION

Figure 1A:
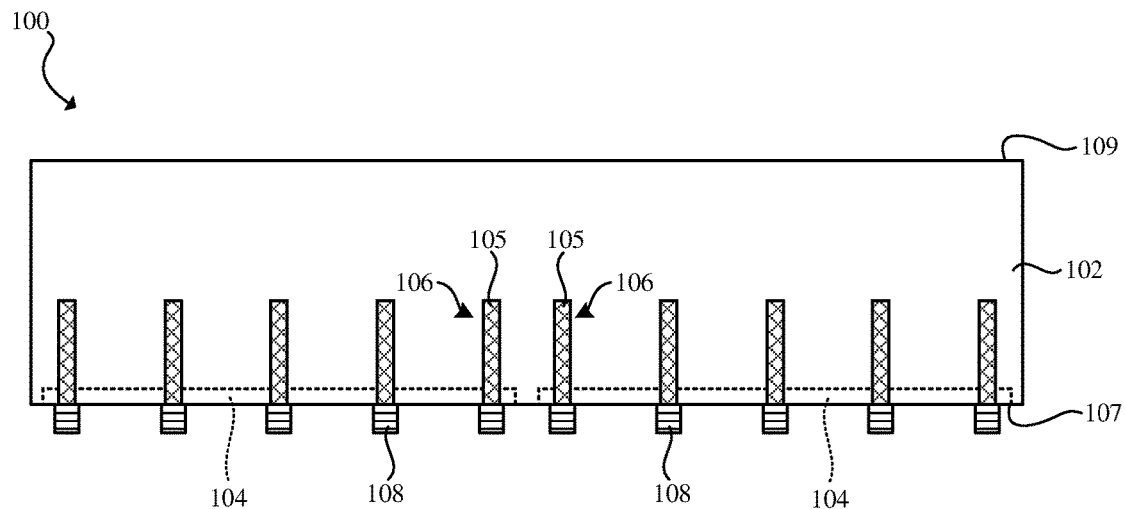
FIGS. 1A-1D and 1F-1H are side cross-sectional views illustrating various stages in a method of manufacturing a semiconductor device in accordance with embodiments of the present technology.

Specific details of several embodiments of semiconductor devices, and associated systems and methods, are described below. A person skilled in the relevant art will recognize that suitable stages of the methods described herein can be performed at the wafer level or at the die level. Therefore, depending upon the context in which it is used, the term "substrate" can refer to a wafer-level substrate or to a singulated, die-level substrate. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, spin coating, and/or other suitable techniques. Similarly, materials can be removed, for example, using plasma etching, wet etching, chemical-mechanical planarization, or other suitable techniques. A person skilled in the relevant art will also understand that the technology may have additional embodiments, and that the technology may be practiced without several of the details of the embodiments described below with reference to FIGS. 1A-9.

In several of the embodiments described below, a semiconductor die (e.g., a memory die) includes an optical routing layer formed on a back side thereof. More specifically, a semiconductor die can include a substrate having a front side, a plurality of circuit elements at the front side, and a back side opposite the front side. The substrate can include through-substrate vias (TSVs) in the substrate, the TSVs including a conductive material extending through the substrate and projecting beyond the back side of the substrate. The optical routing layer can be formed on the back side of the substrate and around the conductive material of the TSVs that projects beyond the back side of the substrate. The optical routing layer can include two or more passivation materials having different refractive indices that are patterned to form passive optical components such as optical waveguides and/or vertical coupling gratings. In some embodiments, an active optical component can be (i) electrically coupled to the conductive material of at least one of the TSVs and (ii) optically coupled to the optical routing layer. An optical fiber can be optically coupled to the optical routing layer for transmitting and/or receiving optical signals to/from the active optical component.

Notably, the optical routing layer can be formed from passivation materials that are deposited around the exposed portions of TSVs during conventional semiconductor die manufacturing processes (e.g., TSV-reveal processes). As such, the optical routing layer can provide additional functionality—such as optical in/out (I/O) signal routing-without increasing the size of a semiconductor die. The optical routing layer can further enable an optical I/O connection to a package incorporating the semiconductor die. That is, optical signals can be sent to/received from the semiconductor die package without additional electrical signal routing to external optical components—such as active optical components disposed side-by-side with the semiconductor package on an interposer. This can reduce the amount of conductive metal (e.g., copper wires, traces, etc.) in the data path, thereby increasing the efficiency of the semiconductor die package by, for example, reducing or eliminating the need for repeater chips or other components for boosting signal strength and/or integrity during data transmission at high bandwidths.

Numerous specific details are disclosed herein to provide a thorough and enabling description of embodiments of the present technology. A person skilled in the art, however, will understand that the technology may have additional embodiments and that the technology may be practiced without several of the details of the embodiments described below with reference to FIGS. 1A-9. For example, some details of semiconductor devices and/or packages well known in the art have been omitted so as not to obscure the present technology. In general, it should be understood that various other devices and systems in addition to those specific embodiments disclosed herein may be within the scope of the present technology.

As used herein, the terms "vertical," "lateral," "upper," "lower," "above," and "below" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

Figure 1B:
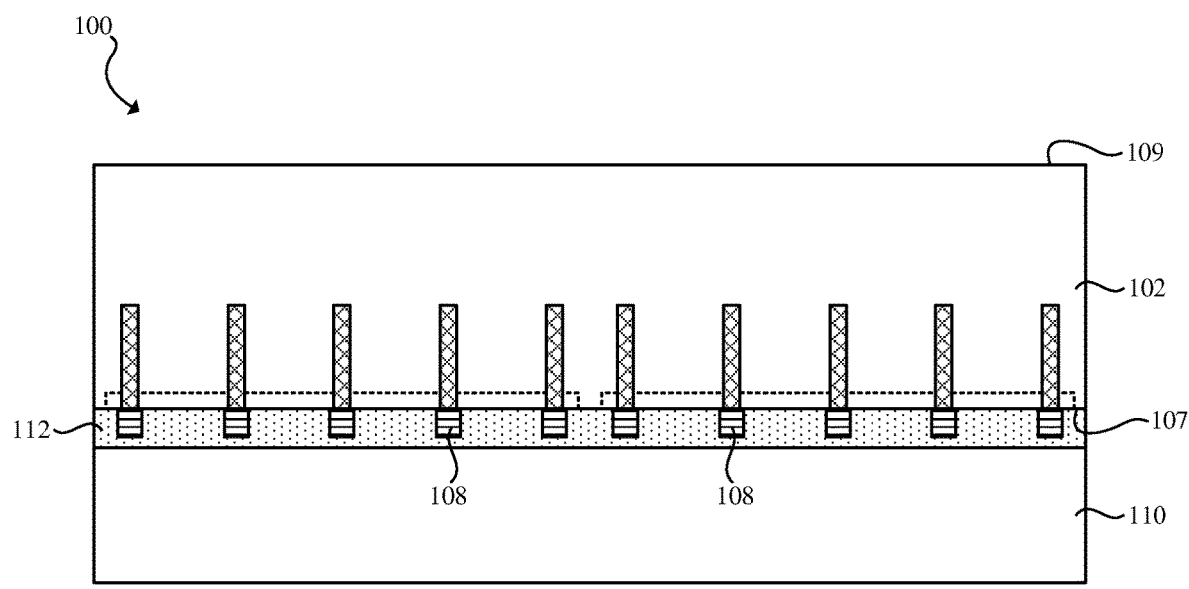
Figure 1C:
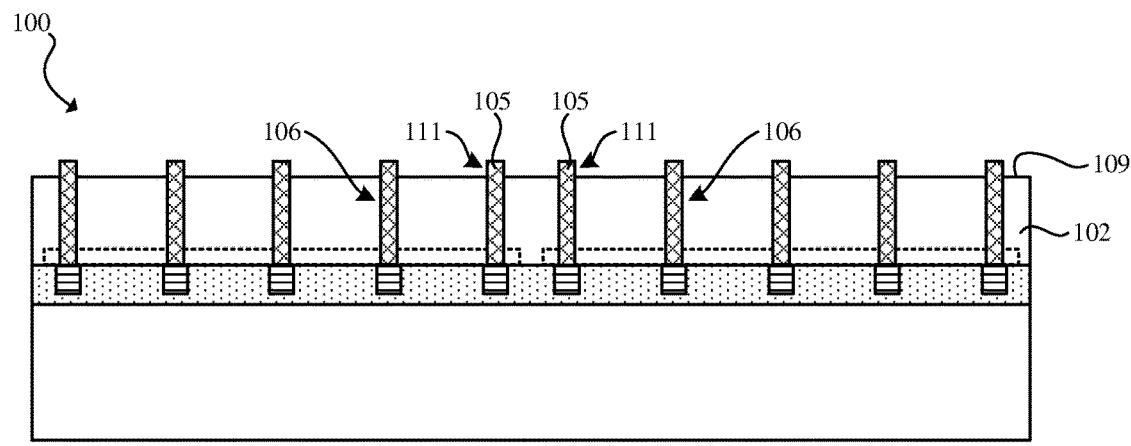
Figure 1D:
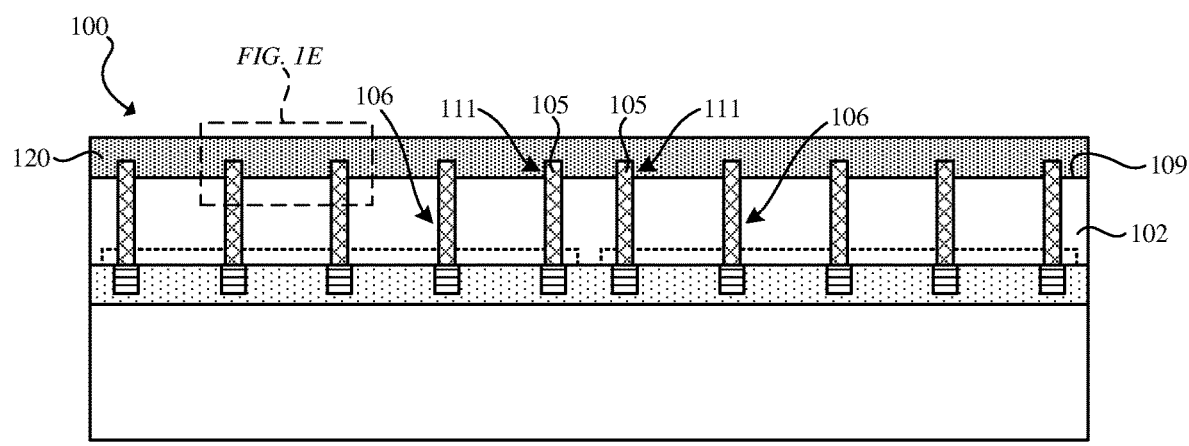
Figure 1E:
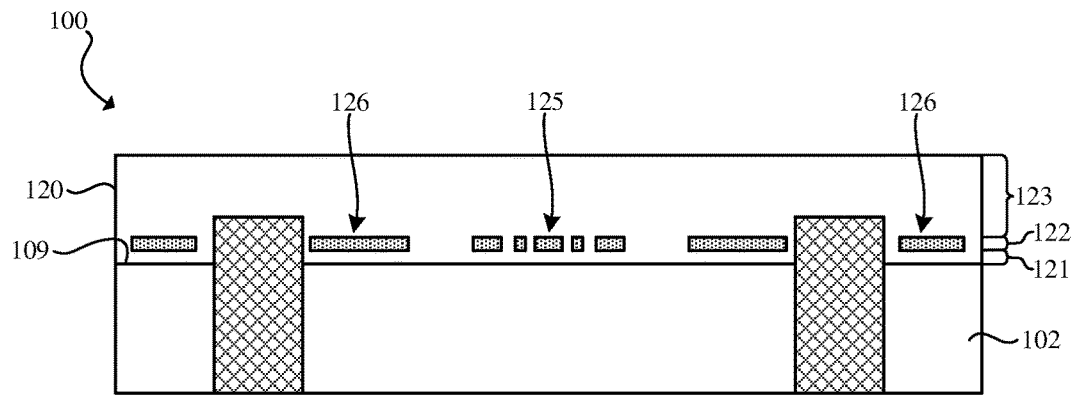
FIG. 1E is an enlarged view of a portion of the semiconductor device shown in FIG. 1D.
Figure 1F:
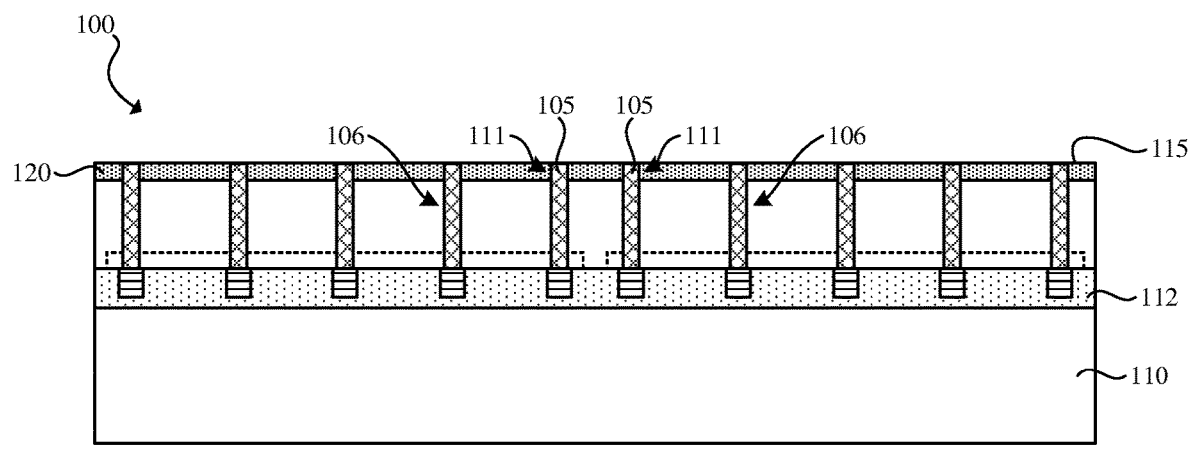

FIGS. 1A-1D and 1F-H are side cross-sectional views illustrating various stages in a method of manufacturing a semiconductor device 100, such as a memory device, in accordance with the present technology. FIG. 1E is an enlarged view of a portion of the semiconductor device 100 shown in FIG. 1D. Generally, a semiconductor device can be manufactured as a discrete device or as part of a larger wafer or panel. In wafer-level or panel-level manufacturing, a larger semiconductor device is formed before being singulated to form a plurality of individual devices. For ease of explanation and understanding, FIGS. 1A-1G illustrate the fabrication of the semiconductor device 100 which is singulatable into two individual semiconductor devices (e.g., semiconductor dies) 101 (FIG. 1F). However, one skilled in the art will readily understand that the fabrication of the semiconductor device 100 can be scaled to the wafer and/or panel level-that is, to include many more components so as to be capable of being singulated into more than two semiconductor dies 101-while including similar features and using similar processes as described herein.

As shown in FIG. 1A, the semiconductor device 100 includes a substrate 102 having a front side 107, a back side 109 opposite the front side 107, and a plurality of circuit elements 104 (e.g., wires, traces, interconnects, transistors, etc.; shown schematically) in and/or on the front side 107. For example, metal traces can be formed on the front side 107 of the substrate 102, while integrated circuit elements can be located in the substrate 102 beneath the metal traces. The circuit elements 104 can include, for example, memory circuits (e.g., a dynamic random memory (DRAM) or other type of memory circuits), controller circuits (e.g., DRAM controllers), logic circuits, and/or other circuits. In other embodiments, the substrate 102 can be a "blank" substrate that does not include integrated circuit components and that is formed from, for example, crystalline, semi-crystalline, and/or ceramic substrate materials, such as silicon, polysilicon, aluminum oxide ($Al_2O_3$), sapphire, and/or other suitable materials.

FIG. 1A further shows the semiconductor device 100 after one or more through-substrate vias (TSVs) 106 have been formed in the substrate 102. Where the substrate 102 is a silicon substrate, the TSVs 106 can be through-silicon vias. In the illustrated embodiment, the TSVs 106 extend from the front side 107 into the substrate 102 but are not yet accessible at the back side 109 (e.g., the TSVs 106 are not exposed or revealed from the substrate 102 at the back side 109). The TSVs 106 can include a conductive material 105 that is electrically coupled to the circuit elements 104, and can be formed using well known processes in the art. For example, the TSVs 106 can be fabricated by forming (e.g., etching) holes through the front side 107 of the substrate 102 and filling the holes with the conductive material 105. The process for forming the holes can include a photolithographic process followed by one or more wet and/or dry chemical etch processes. The conductive material 105 can comprise copper, nickel, solder (e.g., SnAg-based solder), conductor-filled epoxy, and/or other electrically conductive materials. In some embodiments, the TSVs 106 can include a barrier material and/or other materials disposed between the conductive material 105 and the surrounding substrate 102.

FIG. 1A further shows the semiconductor device 100 after conductive pillars 108 have been formed on the front side 107 of the substrate 102 to be electrically coupled to the conductive material 105 of corresponding ones of the TSVs 106. In some embodiments, the conductive pillars 108 are relatively tall structures having a height above the front side 107 of the substrate 102 of between about 10-100 μm (e.g., between about 35-60 μm). The conductive pillars 108 can be fabricated by a suitable electroplating or electroless plating process, as is known in the art. In other embodiments, other deposition techniques (e.g., sputter deposition) can be used in lieu of electroplating or electroless plating. Accordingly, the conductive pillars 108 can comprise copper, nickel, aluminum, solder (e.g., SnAg-based solder), conductor-filled epoxy, and/or other electrically conductive materials, and can comprise one or more layers of the same or different conductive materials. In some embodiments, the conductive pillars 108 include one or more seed layers suitable for facilitating a plating process.

FIG. 1B shows the semiconductor device 100 after the substrate 102 has been attached to a carrier 110 via an adhesive layer 112. The carrier 110 can provide additional stability and mechanical support throughout subsequent processing steps on the back side 109 of the substrate 102, and can later be decoupled (e.g., released, removed, etc.) from the substrate 102. The carrier 110 can be a temporary carrier formed from, for example, silicon, silicon-on-insulator, compound semiconductor (e.g., Gallium Nitride), glass, or other suitable materials. The adhesive layer 112 can be a disposable film (e.g., a laminate film of epoxy-based material) or other suitable material that secures the carrier 110 to the front side 107 of the substrate 102 and/or to the conductive pillars 108.

FIG. 1C shows the semiconductor device 100 after the back side 109 of the substrate 102 has been thinned to expose the conductive material 105 of the TSVs 106 through the back side 109 of the substrate. The substrate 102 can be thinned using, for example, a suitable backgrinding process known in the art. In the illustrated embodiment, after thinning the substrate 102, a projecting portion 111 of the conductive material 105 in individual ones of the TSVs 106 projects beyond the back side 109 of the substrate 102. In other embodiments, the substrate 102 can be thinned such that the conductive material 105 in some of the TSVs 106 does not project beyond the back side 109 and/or is not revealed or exposed at the back side 109. For example, the back side 109 of the substrate 102 can be coplanar with an upper surface of the conductive material 105 in one or more of the TSVs 106.

FIG. 1D shows the semiconductor device 100 after forming an optical routing layer 120 over the back side 109 of the substrate 102 and over the projecting portions 111 of the conductive material 105 of the TSVs 106. In general, the optical routing layer 120 comprises multiple layers of passivation, dielectric, or other suitable insulating materials such as, for example, silicon oxide, silicon nitride, tetraethyl orthosilicate (TEOS), etc. The multiple layers of passivation material comprise at least two different materials having different refractive indices such that the optical routing layer 120 comprises one or more passive optical components (e.g., waveguides, vertical coupling gratings, etc.). More specifically, in some embodiments, referring to the enlarged view of the optical routing layer 120 shown in FIG. 1E, the optical routing layer 120 can include (i) a first layer 121 of a first material formed on the back side 109 of the substrate 102, (ii) a second layer 122 of a second material formed over the first layer 121, and (iii) a third layer 123 of a third material formed over the second layer 122. The second material of the second layer 122 can have a higher refractive index than the first and third materials of the first and third layers 121, 123. In some embodiments, for example, the first and third materials can both comprise a silicon oxide material while the second material comprises a silicon nitride material. Accordingly, the first and third layers 121, 123 can act as cladding layers to confine light signals transmitted via the optical routing layer 120 to within the second layer 122.

The second layer 122 can be patterned to form the one or more passive optical components. In the illustrated embodiment, for example, the second layer is patterned to form (i) a vertical grating coupling portion 125 (e.g., a distributed Bragg grating) and (ii) waveguide portions 126 that are optically coupled to the vertical grating coupling portion 125. The waveguide portions 126 are configured to route optical signals generally laterally along the back side 109 of the substrate 102, while the vertical grating coupling portion 125 is configured to redirect the optical signals generally vertically into and/or out of the optical routing layer 120 (e.g., to/from an optical fiber or active optical component, as described in detail below). In general, the optical routing layer 120 can include any number of vertical grating coupling portions and/or other optical components. In some embodiments, for example, at least a portion of the second layer 122 can be patterned to form a ring oscillator that can filter incoming optical signals. In some embodiments, one or more heater elements (e.g., metal layers) can be formed in, on, and/or below the optical routing layer 120 and can be electrically connected to the conductive material 105 in one or more of the TSVs. The heater elements can be configured to selectively heat the optical routing layer 120 to, for example, act as a thermal-optic switch (e.g., as described in detail below with reference to FIG. 3).

The optical routing layer 120 can be fabricated using photolithographic, laser direct writing, UV-laser direct imaging, nano-imprint lithographic, mosquito (e.g., needle-type liquid microdispensing), and/or other suitable deposition and patterning methods known in the art. Notably, the optical routing layer 120 can be formed as part of a standard TSV reveal process in place of a standard passivation layer (e.g., an integral layer of passivation material having no optical components or functionality). Accordingly, the optical routing layer 120 can provide an optical I/O interface for the semiconductor device 100 without increasing the overall size of the semiconductor device 100 compared to conventional devices.

While three layers 121-123 are illustrated in FIG. 1E, the optical routing layer 120 can be formed using any number of layers, materials, etc. For example, the optical routing layer 120 can include multiple patterned layers of high-refractive index material to form more complex optical components. Moreover, in the illustrated embodiment, the optical routing layer is formed over substantially the entire back side 109 of the substrate 102. In other embodiments, the optical routing layer can be formed over only a portion of the back side 109 of the substrate 102. For example, other portions of the back side 109 can be fill patterned for controlling or inhibiting stress and/or warpage of the substrate 102. Similarly, additional layers may be added or the thickness of the layers 121-123 can be locally modified to optimize adhesion, reduce reflection, etc.

As shown in FIG. 1F, the optical routing layer 120 (e.g., the third layer 123 of the optical routing layer 120 shown in FIG. 1E) and/or the projecting portions 111 of the conductive material 105 of the TSVs 106 are subsequently thinned to co-planarize the conductive material 105 and the optical routing layer 120. Therefore, after thinning, the conductive material 105 of the TSVs 106 and the optical routing layer 120 together define a generally planar back side 115 of the semiconductor device 100. Thinning can be achieved using, for example, a chemical mechanical planarization (CMP) process.

Figure 1G:
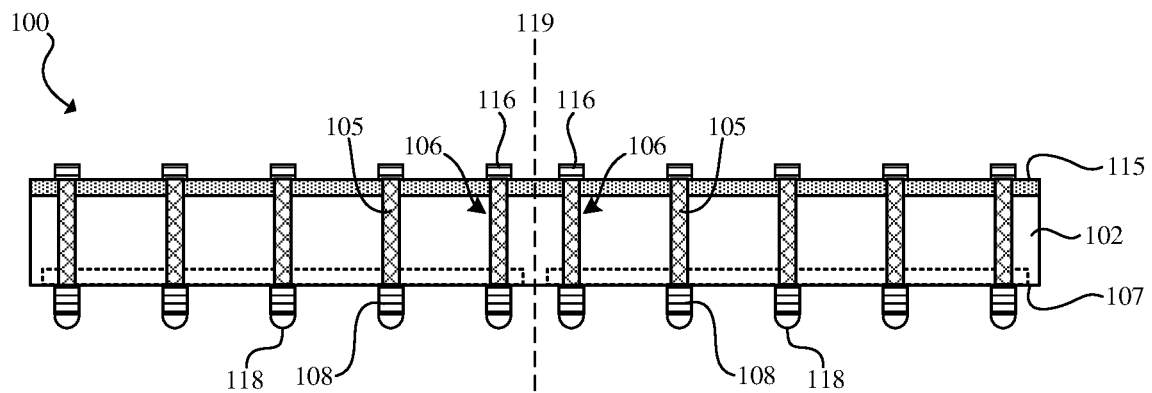

FIG. 1G shows the semiconductor device 100 after UBM features 116 have been formed on the back side 115 of the semiconductor device 100 to be electrically coupled to the conductive material 105 of corresponding ones of the TSVs 106. The UBM features 116 are relatively short features compared to the conductive pillars 108 and, in some embodiments, can have a height above the back side 115 of the semiconductor device 100 of between about 1-10 μm (e.g., between about 1-5 μm). The UBM features 116 can be fabricated by a suitable electroplating or electroless plating process, as is known in the art. In other embodiments, other deposition techniques (e.g., sputter deposition) can be used in lieu of electroplating or electroless plating. FIG. 1G further illustrates the semiconductor device 100 after the carrier 110 and the adhesive layer 112 (FIG. 1F) have been removed. In some embodiments, the adhesive layer 112 allows the carrier 110 to be easily removed from the semiconductor device 100 via a vacuum, poker pin, laser or other light source, or other suitable method such that the carrier 110 can be reused again. Removing the carrier 110 and the adhesive layer 112 exposes the front side 107 of the substrate 102 and the conductive pillars 108. FIG. 1G further illustrates the semiconductor device 100 after depositing solder balls or solder bumps 118 onto the conductive pillars 108. In some embodiments, for example, a stenciling machine can deposit discrete blocks of solder paste onto the conductive pillars 108 and the solder paste can then be reflowed to form the solder bumps 118 on the conductive pillars 108.

Figure 1H:
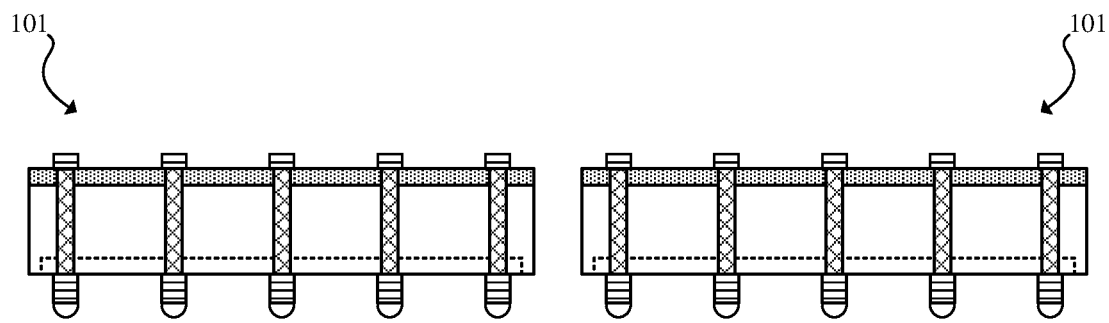

As further shown in FIG. 1G, a singulating lane 119 can be provided along the semiconductor device 100 to, for example, facilitate singulation of the semiconductor device 100 into a plurality of smaller semiconductor devices (e.g., semiconductor dies). Accordingly, FIG. 1H shows the semiconductor device 100 after being singulated to form two semiconductor dies 101. Specifically, the substrate 102 can be cut at and/or along the singulating lane 119 to separate the semiconductor dies 101 from one another. Once singulated, the individual semiconductor dies 101 can be attached to external circuitry via the conductive pads 116 and/or the conductive pillars 108, and thus incorporated into a myriad of systems, assemblies, packages, and/or devices.

Figure 2A:
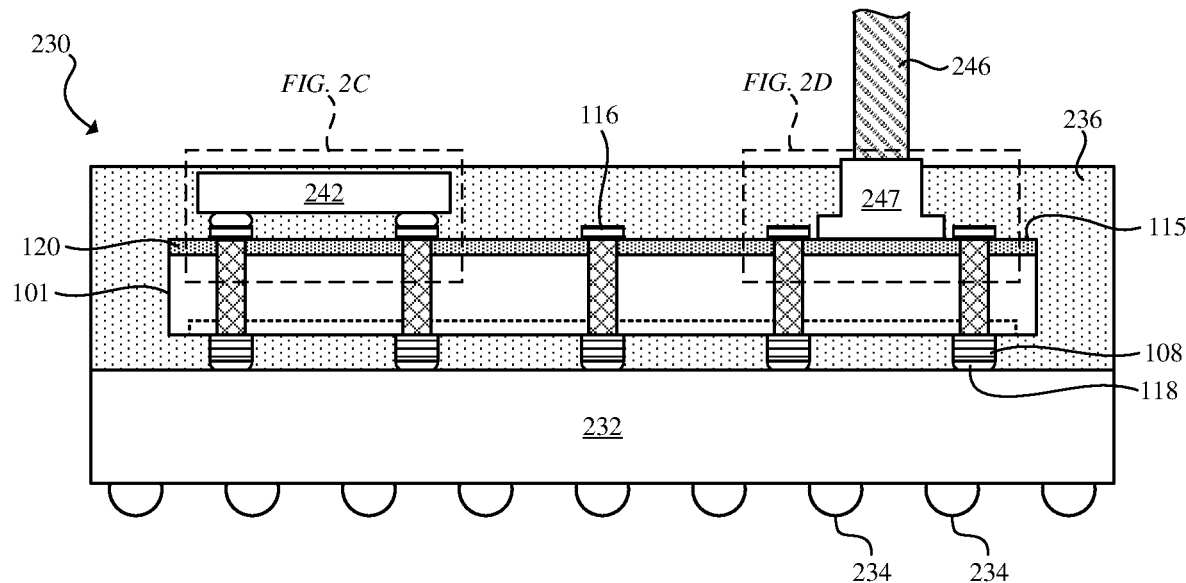
FIGS. 2A and 2B are a side cross-sectional view and a partially schematic top view, respectively, of a semiconductor die package in accordance with embodiments of the present technology.
Figure 2B:
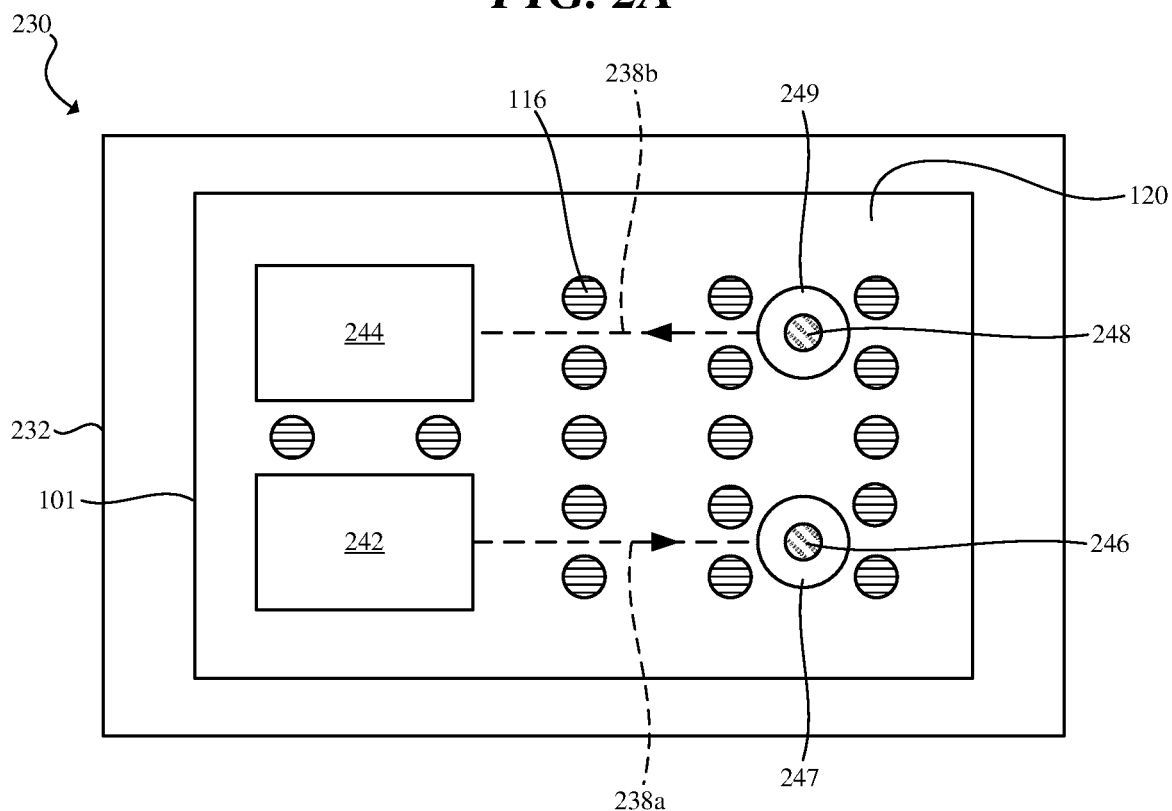

For example, FIGS. 2A and 2B are a side cross-sectional view and a partially schematic top view, respectively, of a semiconductor die assembly or package 230 ("package 230") including the semiconductor die 101 in accordance with embodiments of the present technology. Referring to FIG. 2A, the semiconductor die 101 can be carried by a package substrate 232 and electrically coupled to the package substrate 232 via the conductive pillars 108 and solder balls bumps 118. The package substrate 232 can include a redistribution layer, an interposer, a printed circuit board, a dielectric spacer, another semiconductor die (e.g., a logic die), or another suitable substrate. The package substrate 232 can further include electrical connectors 234 (e.g., solder balls, conductive bumps, conductive pillars, conductive epoxies, and/or other suitable electrically conductive elements) electrically coupled to the package substrate 232 and configured to electrically couple the package 230 to external devices or circuitry (not shown).

Referring to FIGS. 2A and 2B together, the package 230 further includes a first active optical component 242, a second active optical component 244 (obscured in FIG. 2A), a first optical fiber 246, and a second optical fiber 248 (obscured in FIG. 2A). The active optical components 242, 244 are both (i) electrically coupled to the semiconductor die 101 and/or the package substrate 232 via one or more of the UBM features 116 (e.g., for receiving power) and (ii) optically coupled to the optical routing layer 120. The active optical components 242, 244 can be optical transmitters (e.g., laser light sources), receivers (e.g., photodiodes), transceivers, etc. In the illustrated embodiment, for example, the first active optical component 242 is an optical transmitter (e.g., a vertical-cavity surface-emitting laser (VCSEL)) configured to receive electrical signals (e.g., I/O data signals) from the semiconductor die 101 and convert the electrical signals to optical signals, and the second active optical component 244 is an optical receiver configured to receive optical signals (e.g., I/O data signals) from external circuitry (not shown) and convert the optical signals to electrical signals. The optical fibers 246, 248 are both optically coupled to the optical routing layer 120. In some embodiments, the optical fibers 246, 248 are attached and/or optically coupled to the optical routing layer 120 via first and second connectors 247, 249 respectively.

Figure 2C:
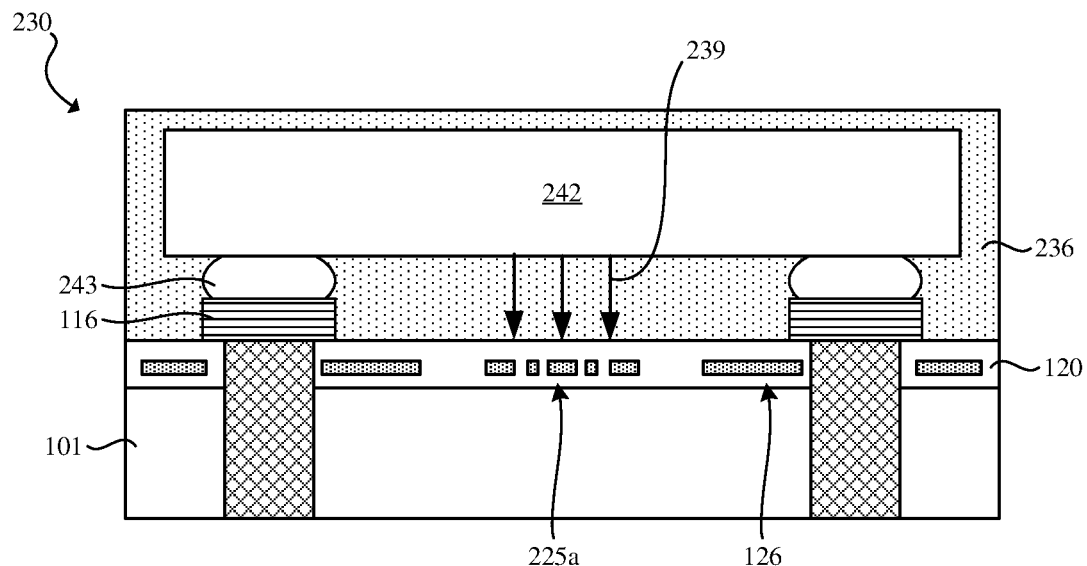
FIGS. 2C and 2D are enlarged views of the semiconductor die assembly shown in FIG. 2A in accordance with embodiments of the present technology.
Figure 2D:
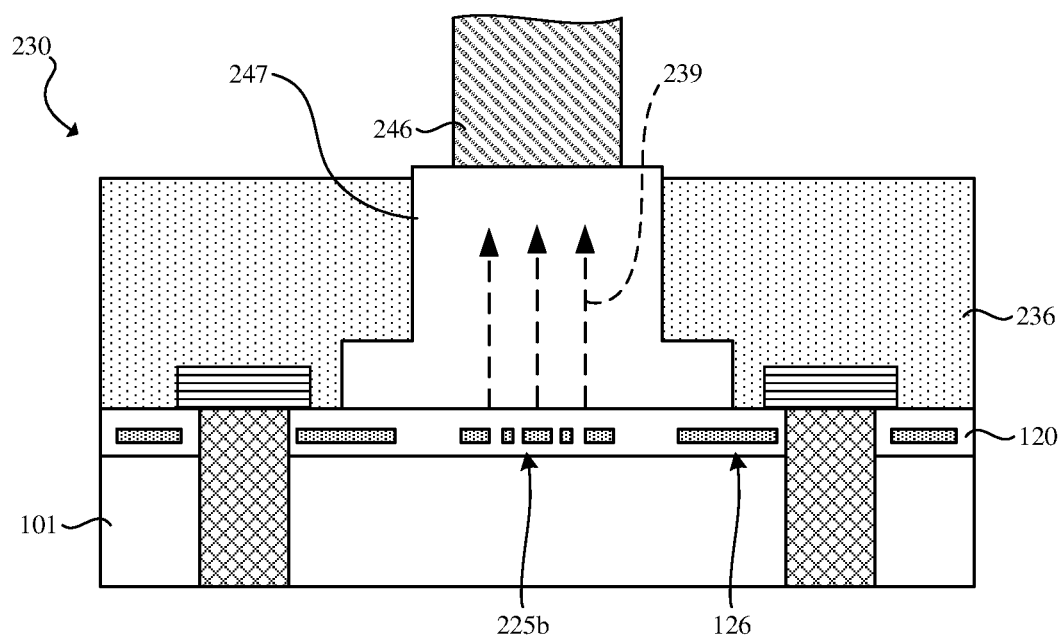

More particularly, FIGS. 2C and 2D are enlarged views of the package 230 of FIG. 2A showing the first active optical component 242 and the first optical fiber 246, respectively, in accordance with embodiments of the present technology. Referring to FIGS. 2B and 2C together, the first active optical component 242 can be electrically coupled to the UBM features 116 of the semiconductor die 101 via conductive features such as solder balls or bumps 243. The first active optical component 242 can have a light source (e.g., a laser source) that is aligned with (e.g., positioned over) a first vertical grating coupling portion 225a of the optical routing layer 120. In operation, the semiconductor die 101 can modulate light signals 239 produced by the first active optical component 242. The first vertical grating coupling portion 225a is configured to receive the light signals 239 and route or direct the modulated light signals 239 into the waveguide portions 126 of the optical routing layer 120 for transmission to the first optical fiber 246.

Referring to FIGS. 2B and 2D, the first connector 247 and/or the first optical fiber 246 can abut the optical routing layer 120 such that the first optical fiber 246 is aligned with a second vertical grating coupling portion 225b of the optical routing layer 120. In other embodiments, an optically transparent epoxy, refractive-index-matching epoxy, index-matching gel, etc., can be disposed between the first optical fiber 246 and the optical routing layer 120. In operation, the second vertical grating coupling portion 225b is configured to receive the light signals 239 from the waveguide portions 126 and route the light signals 239 into the first optical fiber 246 (e.g., for transmission to external circuitry).

In some embodiments, the second active optical component 244 and the second optical fiber 248 can be optically coupled via the optical routing layer 120 in a generally similar manner as the first active optical component 242 and the first optical fiber 246. For example, as shown in FIG. 2B, the first active optical component 242 can be optically coupled to the first optical fiber 246 via a first (e.g., transmit) optical path 238a (shown schematically) formed in the optical routing layer 120 for transmitting optical signals from the package 230. Likewise, the second active optical component 244 can be optically coupled to the second optical fiber 248 via a second (e.g., receive) optical path 238b (shown schematically) formed in the optical routing layer 120 for receiving optical signals from outside the package 230. In some embodiments, the optical paths 238 are separate, isolated paths while, in other embodiments, the optical paths 238 can be the same path or can partially overlap.

Referring to FIGS. 2A-2D together, a mold material 236 (not shown in FIG. 2B for the sake of clarity) can be formed over the package substrate 232 and at least partially around the semiconductor die 101, the active optical components 242, 244, the optical fibers 246, 248, and/or the connectors 247, 249 to protect these components from external contaminants or forces. Moreover, in the illustrated embodiment, the mold material 236 surrounds a portion of the connectors 247, 249 to secure or maintain the position of the optical fibers 246, 248 relative to the optical routing layer 120 (e.g., to maintain the alignment of the optical fibers 246, 248 with the vertical grating coupling portions 225). In other embodiments, the package 230 can include an adhesive between the connectors 247, 249 and/or the optical fibers 246, 248 and the optical routing layer 120. In some embodiments, the mold material 236 is not between the active optical components 242, 244 and the optical routing layer 120 and/or an optically transparent epoxy, index-matching gel, etc., can be disposed between the active optical components 242, 244 and the optical routing layer 120 instead of the mold material 236 to permit or enable the transmission of optical signals therebetween. Moreover, in the illustrated embodiment, the mold material 236 extends upward beyond the back side 115 of the semiconductor die 101 while, in other embodiments, the mold material 236 can be coplanar with or below the back side 115 such that the optical routing layer 120 is exposed.

Figure 3:
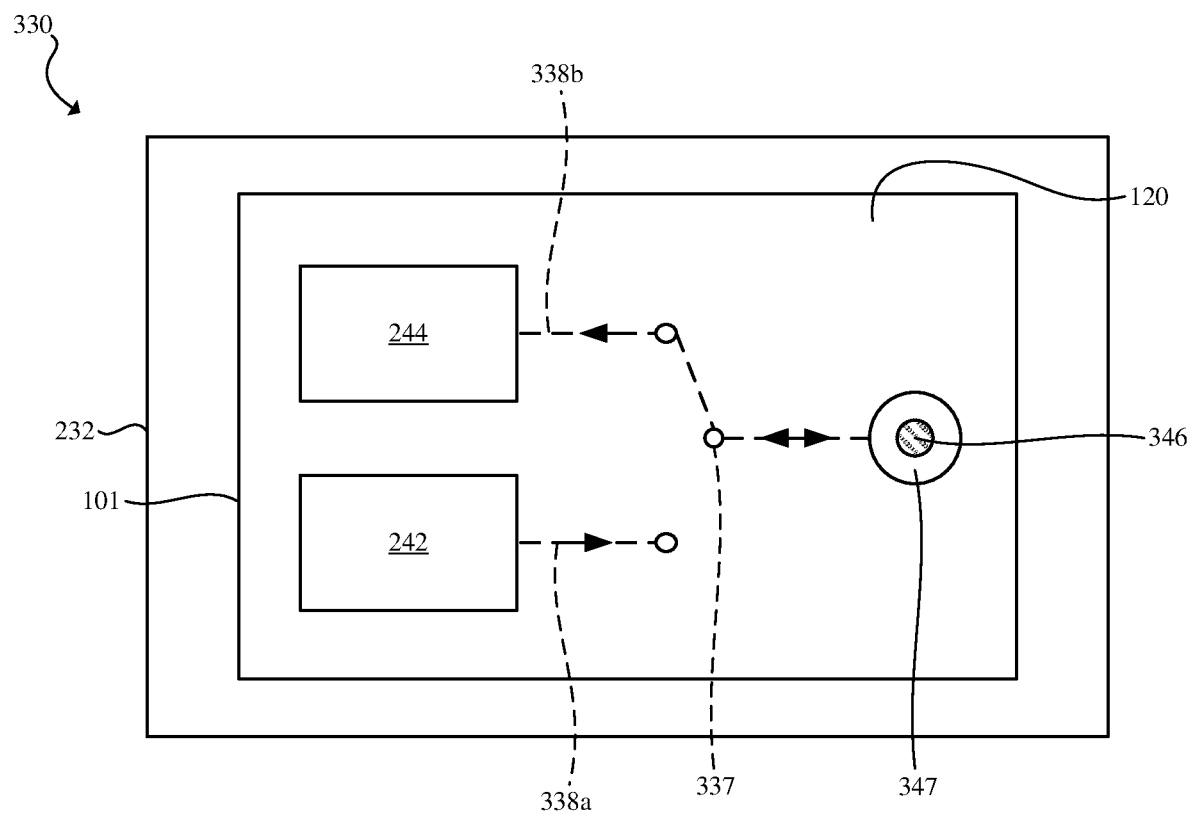
FIG. 3 is a partially-schematic top view of a semiconductor die package in accordance with an embodiment of the present technology.

Although two optical fibers and two active optical components are illustrated in FIGS. 2A-2D, in practice, any number of optical fibers and/or active optical components can be optically coupled to an optical routing layer configured in accordance with the present technology. FIG. 3, for example, is a partially schematic top view of a semiconductor die assembly or package 330 ("package 330") including the semiconductor die 101 in accordance with another embodiment of the present technology. The package 330 can include features generally similar to the package 230 described in detail with reference to FIGS. 2A-2D. For example, the package 330 includes the semiconductor die 101 having the optical routing layer 120, the package substrate 232, and the active optical components 242, 244.

In the illustrated embodiment, however, only a single optical fiber 346 is optically coupled to the optical routing layer 120 via a connector 347. In some embodiments, the optical routing layer 120 includes a switch 337 that is operable to optically couple either (i) the first active optical component 242 to the optical fiber 346 via a first (e.g., transmit) optical path 338a formed in the optical routing layer 120 or (ii) the second active optical component 244 to the optical fiber 346 via a second (e.g., receive) optical path 338b formed in the optical routing layer 120. In the illustrated embodiment, the switch 337 is shown optically coupling the second active optical component 244 to the optical fiber 346 (e.g., completing the second optical path 338b) to, for example, enable the semiconductor die 101 to receive optical signals from the optical fiber 346. As described in detail above, the switch 337 can be a thermal-optic switch (e.g., a thermally-modulated switch) that is triggered via selective heating of the optical routing layer 120. In other embodiments, the package 330 could include more than two active optical components optically coupled to the optical fiber 346 via the switch 337, and/or more than two optical fibers optically coupled to the active optical components 242, 244 via one or more switches formed in the optical routing layer 120.

Figure 4:
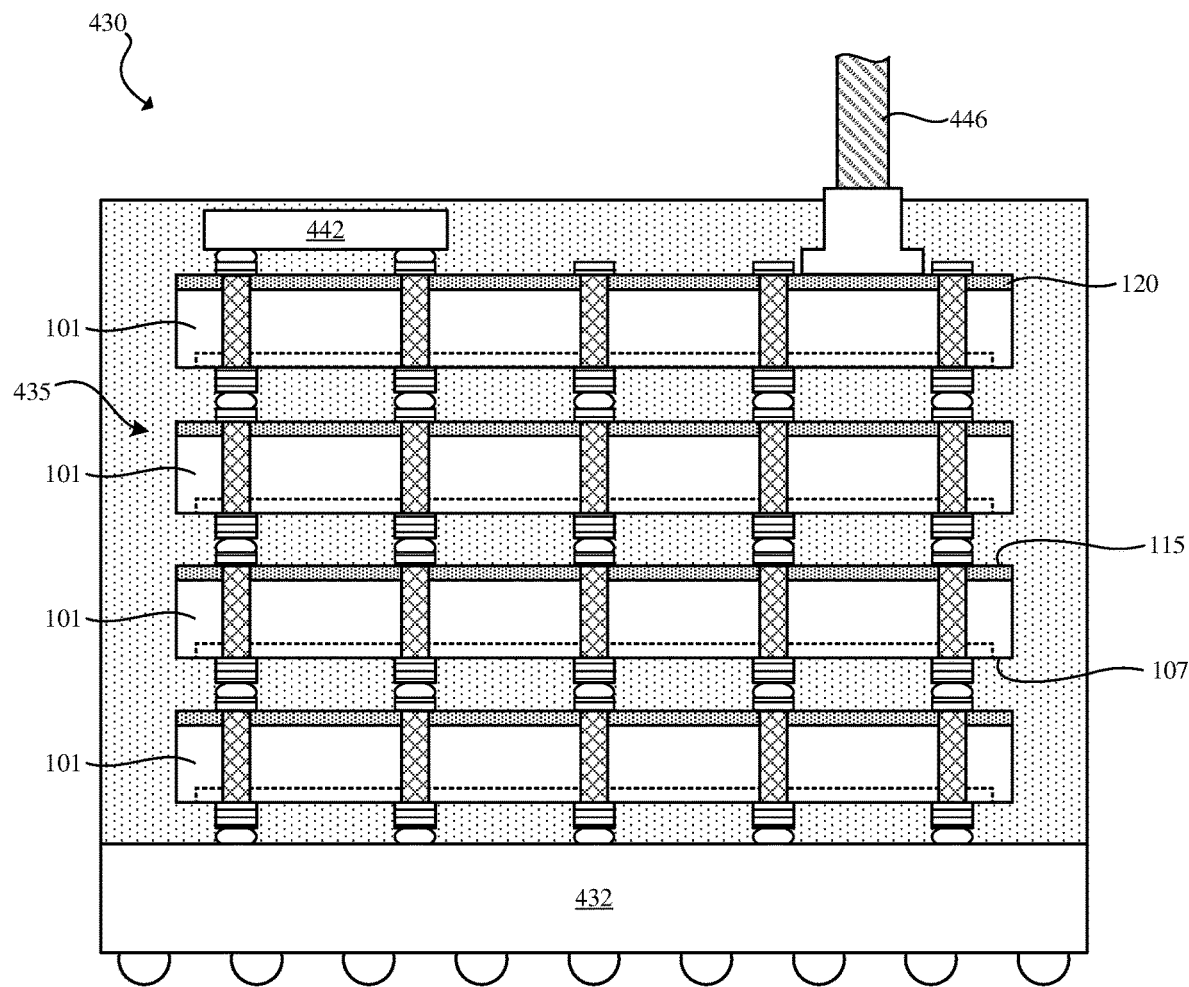
FIG. 4 is a side cross-sectional view of a semiconductor die package in accordance with an embodiment of the present technology.

In some embodiments, semiconductor packages in accordance with the present technology can include multiple stacked semiconductor dies. For example, FIG. 4 is a side cross-sectional view of a semiconductor die assembly or package 430 ("package 430") in accordance with another embodiment of the present technology. The package 430 includes a plurality of the semiconductor dies 101 arranged in a stack 435 on a package substrate 432. In the illustrated embodiment, the package 430 includes four of the semiconductor dies 101 arranged in a "front-to-back" configuration (e.g., the front, active, side 107 of the semiconductor dies 101 faces the back side 115 of an adjacent one of the semiconductor dies 101). In practice, the package 430 can include a different number of semiconductor dies 101, such as one die, two dies, three dies, five dies, eight dies, sixteen dies, or more. Likewise, the semiconductor dies 101 may have other suitable orientations such as "front-to-front." In some embodiments, the semiconductor dies 101 can be identical (e.g., memory dies manufactured to have the same design and specifications), while in other embodiments the semiconductor dies 101 can be different from each other (e.g., different types of memory dies or a combination of controller, logic, memory, and/or other dies).

As shown, an uppermost one of the semiconductor dies 101 can include the optical routing layer 120. At least one active optical component 442 and at least one optical fiber 446 can be optically coupled to the optical routing layer 120 for transmitting and/or receiving optical signals to/from the package 430. In some embodiments, each of the semiconductor dies 101 can include the optical routing layer 120. In other embodiments, only the uppermost one of the semiconductor dies 101 can include the optical routing layer 120 and the other, lower ones of the semiconductor dies 101 can include, for example, a continuous layer of passivation material over the back side thereof.

Figure 5:
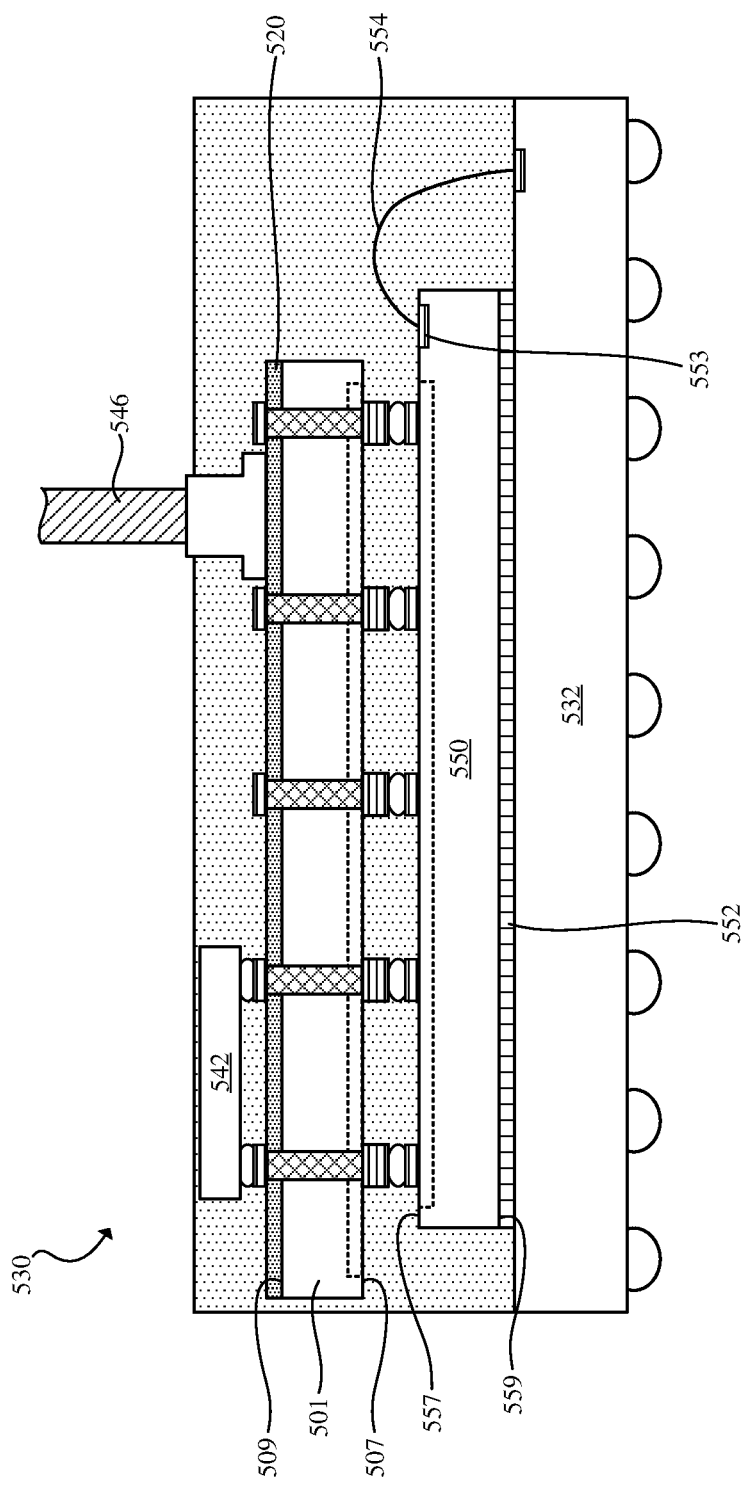
FIG. 5 is a side cross-sectional view of a semiconductor die package in accordance with an embodiment of the present technology.

In some embodiments, semiconductor packages in accordance with the present technology can include multiple semiconductor dies having different orientations. FIG. 5, for example, is a side cross-sectional view of a semiconductor die assembly or package 530 ("package 530") in accordance with another embodiment of the present technology. In the illustrated embodiment, the package 530 includes (i) a first semiconductor die 550 having a back side 559 coupled to a package substrate 532 via a die-attach material 552 (e.g., an adhesive film, epoxy, tape, paste, and/or other suitable material) and (ii) a second semiconductor die 501 stacked over the first semiconductor die 550. The semiconductor dies 550, 501 are arranged in a "front-to-front" configuration in which a front (e.g., active) side 507 of the second semiconductor die 501 faces a front (e.g., active) side 557 of the first semiconductor die 550. The second semiconductor die 501 can include features generally similar to the semiconductor die 101 described in detail above and can include, for example, an optical routing layer 520 over a back side 509 thereof. The first semiconductor die 550 can be a memory die, a logic die (e.g., a controller die), or another type of semiconductor die known in the art.

In the illustrated embodiment, the second semiconductor die 501 is laterally offset from the first semiconductor die 550 to, for example, expose one or more bond pads 553 of the first semiconductor die 550. The bond pads 553 can be electrically coupled to the package substrate 532 via one or more wirebonds 554. Accordingly, in some embodiments, the first semiconductor die 550 need not include any TSVs extending therethrough. Moreover, at least one active optical component 542 and at least one optical fiber 546 can be optically coupled to the optical routing layer 520 of the second semiconductor die 501 for transmitting and/or receiving optical signals to/from the package 530, as described in detail above.

Figure 6:
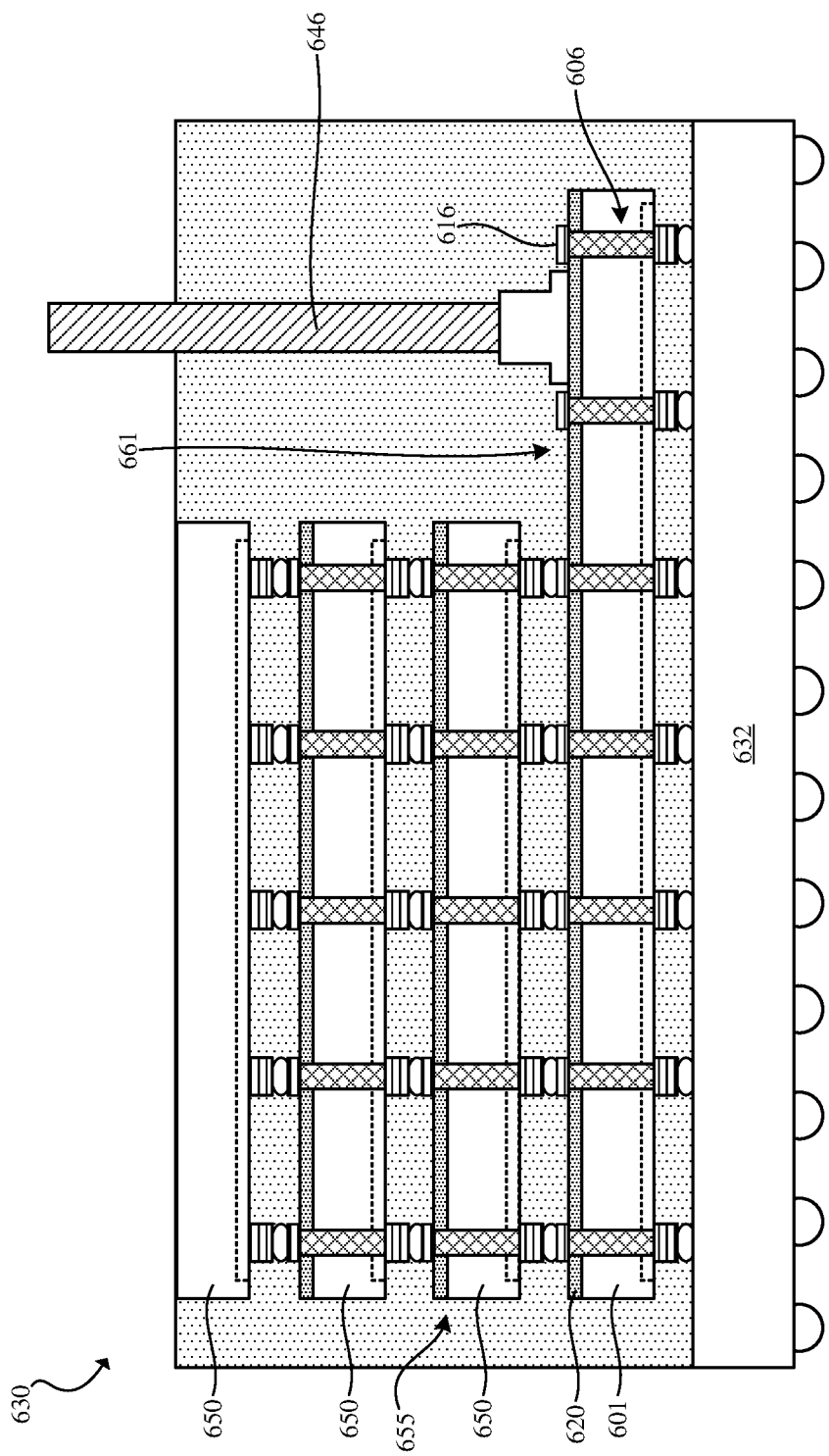
FIG. 6 is a side cross-sectional view of a semiconductor die package in accordance with an embodiment of the present technology.

In some embodiments, semiconductor packages in accordance with the present technology can include an optical routing layer on a lower or base semiconductor die in a stack of semiconductor dies. FIG. 6, for example, is a side cross-sectional view of a semiconductor die assembly or package 630 ("package 630") in accordance with another embodiment of the present technology. In the illustrated embodiment, the package 630 includes (i) a first semiconductor die 601 carried by and electrically coupled to a package substrate 632 and (ii) a plurality of second semiconductor dies 650 arranged in a stack 655 on the first semiconductor die 601. The first semiconductor die 601 can include features generally similar to the semiconductor dies 101 and 501 described in detail above and can include, for example, an optical routing layer 620 over a back side thereof. The second semiconductor dies 650 can be memory dies, logic dies, and/or other types of semiconductor dies known in the art. In some embodiments, the first semiconductor die 601 can be a logic die such as a memory controller, and the second semiconductor dies 650 can be memory dies (e.g., DRAM memory dies). In the illustrated embodiment, the semiconductor dies 601, 650 are arranged in a front-to-back configuration, in other embodiments, the semiconductor dies 601, 650 can have different arrangements (e.g., front-to-front).

As further shown in FIG. 6, the first semiconductor die 601 includes a peripheral portion (e.g., a porch or shelf) 661 that extends laterally outward beyond the stack 655 of the second semiconductor dies 650. At least one active optical component (obscured in FIG. 6) and at least one optical fiber 646 can be (i) electrically coupled to the first semiconductor die 601 (e.g., for receiving power) and/or (ii) optically coupled to the optical routing layer 620 of the first semiconductor die 601 for transmitting and/or receiving optical signals to from the package 630, as described in detail above. In the illustrated embodiment, the first semiconductor die 601 includes TSVs 606 and UBM features 616 electrically coupled to conductive material disposed in the TSVs 606. In some embodiments, the TSVs 606 can be revealed at the peripheral portion 661 while, in other embodiments, some or all of the TSVs 606 need not be revealed at the peripheral portion 661. Moreover, in the illustrated embodiment, an uppermost one of the second semiconductor dies 660 does not include TSVs extending therethrough. In other embodiments, the uppermost one of the second semiconductor dies 650 can have TSVs extending therethrough and/or an optical routing layer formed on an upper (e.g., back side) surface thereof.

Figure 7:
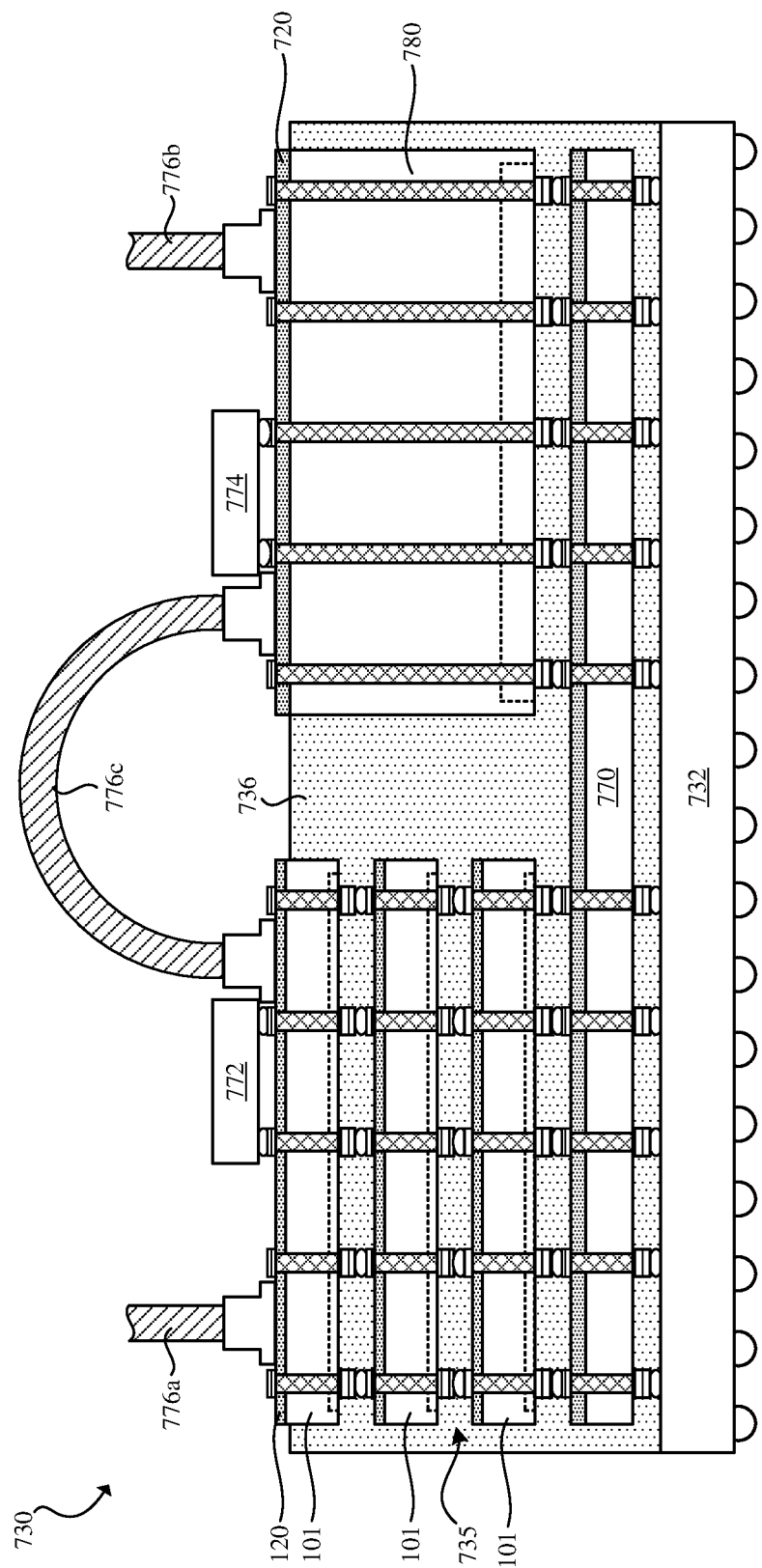
FIG. 7 is a side cross-sectional view of a semiconductor die package in accordance with an embodiment of the present technology.

In some embodiments, semiconductor packages in accordance with the present technology can include intra-package optical connections. FIG. 7, for example, is a side cross-sectional view of a semiconductor die assembly or package 730 ("package 730") in accordance with another embodiment of the present technology. In the illustrated embodiment, the package 730 includes a (i) an interposer 770 carried by and electrically coupled to a package substrate 732, (ii) a plurality of the (first) semiconductor dies 101 (FIGS. 1A-3) arranged in a stack 735 over a first portion of the interposer 770 and electrically coupled to the interposer 770, and (iii) a second semiconductor die 780 positioned over a second portion of the interposer 770 and electrically coupled to the interposer 770. In some embodiments, the first semiconductor dies 101 can be memory dies (e.g., DRAM memory dies) and the second semiconductor die 780 can be a logic die such as a memory controller. In the illustrated embodiment, an uppermost one of the semiconductor dies 101 can include the (first) optical routing layer 120 and the second semiconductor die 780 can include a second optical routing layer 720 formed over a back side thereof. In some embodiments, optical routing layers may also be formed on one or more of the lower first semiconductor dies 101 in the stack 735 and/or on the interposer 770. The interposer 770 can include a printed circuit board, a semiconductor substrate, or other suitable substrate that is formed without integrated circuit components. For example, the interposer 770 can include a "blank" substrate formed from crystalline, semi-crystalline, and/or ceramic substrate materials, such as silicon, polysilicon, aluminum oxide ($Al_2O_3$), sapphire, and/or other suitable materials.

As further shown in FIG. 7, at least one first active optical component 772 is (i) electrically coupled to the uppermost one of the first semiconductor dies 101 and (ii) optically coupled to the first optical routing layer 120. Similarly, at least one first active optical component 774 is (i) electrically coupled to the second semiconductor die 780 and (ii) optically coupled to the second optical routing layer 720. The active optical components 772, 774 can be, for example, photodiodes, laser sources, etc. A first optical fiber 776a is optically coupled to the first optical routing layer 120 and can optically couple the stack 735 of the first semiconductor dies 101 and/or other components of the package 730 to external circuitry. A second optical fiber 776b is optically coupled to the second optical routing layer 720 and can optically couple the second semiconductor die 780 and/or other components of the package 730 to external circuitry. In some embodiments, a third optical fiber 776c extends between and optically couples the optical routing layers 120, 720. Accordingly, the third optical fiber 776c can provide an intra-package optical coupling between the second semiconductor die 780 and the stack 735 of the first semiconductor dies 101 that can, for example, provide for high speed and/or bandwidth data transmission between the semiconductor dies 101, 780.

In some embodiments, a mold material 736 can be formed around and/or over the first semiconductor dies 101, the second semiconductor die 780, the interposer 770, and/or the package substrate 732. In the illustrated embodiment, the optical routing layers 120, 720 are exposed from the mold material 736. In other embodiments, the mold material 736 can be formed over the optical routing layers 120, 720. For example, the mold material 736 can be formed to encapsulate or at least partially surround the third (intra-package) optical fiber 776c to inhibit damage or misalignment of the third optical fiber 776c as a result of external forces.

Figure 8:
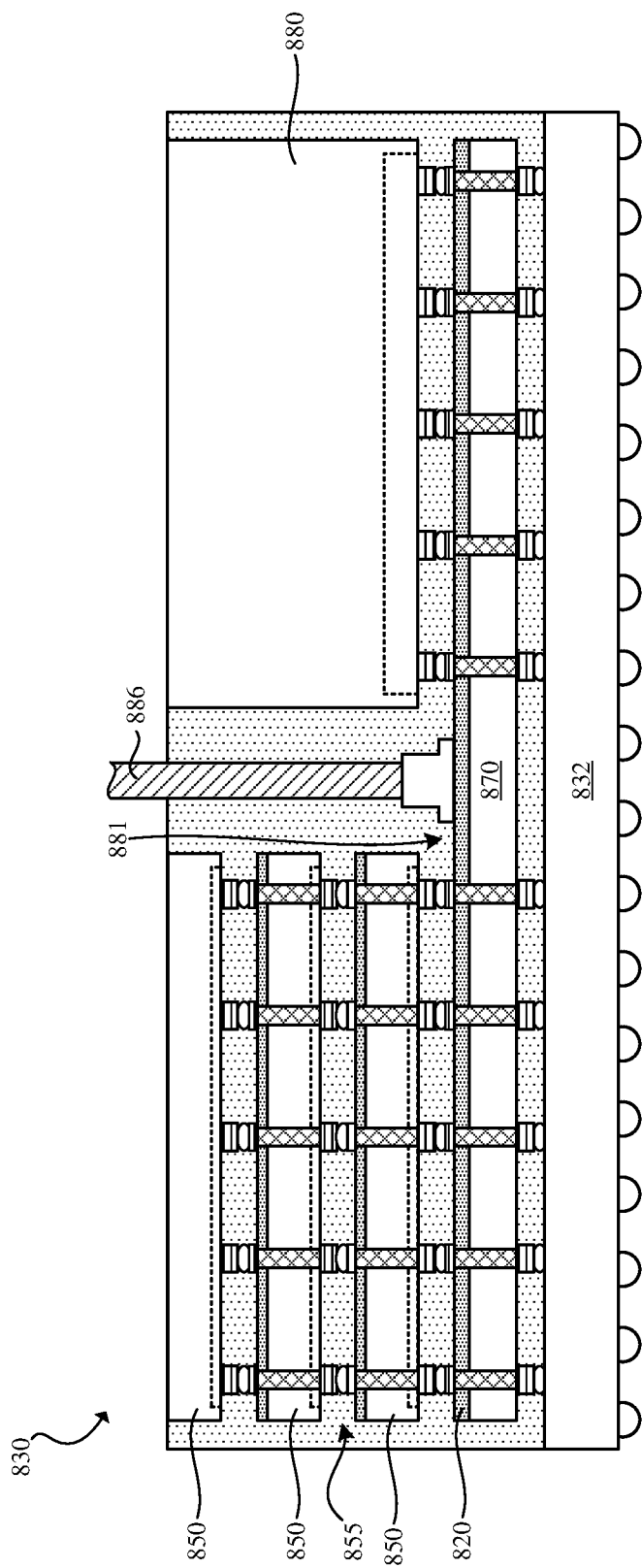
FIG. 8 is a side cross-sectional view of a semiconductor die package in accordance with an embodiment of the present technology.

In some embodiments, semiconductor packages in accordance with the present technology can include an optical routing layer on an interposer configured to carry multiple semiconductor dies. FIG. 8, for example, is a side cross-sectional view of a semiconductor die assembly or package 830 ("package 830") in accordance with another embodiment of the present technology. The package 830 includes several features generally similar to the package 730 described in detail with reference to FIG. 7. For example, the package 830 includes (i) an interposer 870 carried by and electrically coupled to a package substrate 832, (ii) a plurality of first semiconductor dies 850 arranged in a stack 855 over a first portion of the interposer 870 and electrically coupled to the interposer 870, and (iii) a second semiconductor die 880 positioned over a second portion of the interposer 870 and electrically coupled to the interposer 870. In the illustrated embodiment, however, an optical routing layer 820 is formed over the interposer 870 (e.g., a back side of the interposer 870).

As further shown in FIG. 8, the interposer 870 includes an open portion 881 that is laterally between the first and second portions of the interposer 870 and that is not beneath the the stack 855 of the first semiconductor dies 850 or the second semiconductor die 880. At least one active optical component (obscured in FIG. 8) and/or at least one optical fiber 886 can be (i) electrically coupled to the interposer 870 and/or (ii) optically coupled to the optical routing layer 820 of the interposer 870 for transmitting and/or receiving optical signals to from the package 830. In the illustrated embodiment, an uppermost one of the first semiconductor dies 850 and the second semiconductor die 880 do not include TSVs extending therethrough. In other embodiments, the uppermost one of the first semiconductor dies 850 and/or the second semiconductor die 880 can have TSVs extending therethrough and/or an optical routing layer formed on an upper (e.g., back side) surface thereof. Moreover, in other embodiments, the stack 855 of the first semiconductor dies 850 and/or the second semiconductor die 880 can be arranged differently such that the open portion 881 can be a different portion of the interposer 870, such as a peripheral portion of the interposer 870.

From the foregoing, it will be appreciated that specific embodiments of the present technology have been described herein for purposes of illustration, but that various modifications may be made without deviating from the scope of the present technology. That is, in some embodiments, the details of the semiconductor devices and packages may be different than those shown in the foregoing Figures. In general, optical routing layers can be formed as part of a TSV-reveal process (e.g., FIGS. 1A-1H) or other suitable process on (i) memory dies, logic dies, or on other semiconductor dies and/or on (ii) interposers or other substrates that do not include active (e.g., integrated) circuit components. Moreover, different components including optical routing layers can be combined in the same package and the components can be positioned at the top, bottom, or elsewhere in a stack or a package of semiconductor components, or can be positioned side-by-side. Likewise, semiconductor packages can include any number of active optical components, passive optical components, and optical fibers. The optical fibers can be coupled to the optical routing layers and used to optically couple semiconductor packages to external circuitry and/or to optically couple different components in the same package (e.g., an intra-package optical connection). Moreover, in some embodiments, semiconductor packages can include other components such as external heatsinks, casing (e.g., thermally conductive casings), electromagnetic interference (EMI) shielding components, etc.

Figure 9:
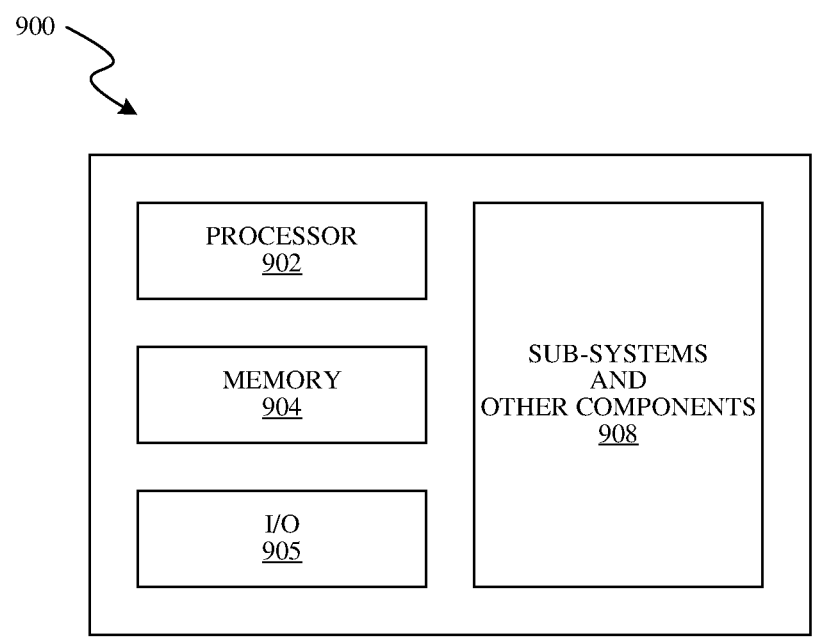
FIG. 9 is a schematic view of a system that includes a semiconductor device in accordance with embodiments of the present technology.

Any one of the semiconductor devices and/or packages having the features described above with reference to FIGS. 1A-8 can be incorporated into any of a myriad of larger and/or more complex systems, a representative example of which is system 900 shown schematically in FIG. 9. The system 900 can include a processor 902, a memory 904 (e.g., SRAM, DRAM, flash, and/or other memory devices), input/output devices 905, and/or other subsystems or components 908. The semiconductor dies and/or packages described above with reference to FIGS. 1A-8 can be included in any of the elements shown in FIG. 9. The resulting system 900 can be configured to perform any of a wide variety of suitable computing, processing, storage, sensing, imaging, and/or other functions. Accordingly, representative examples of the system 900 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 900 include lights, cameras, vehicles, etc. With regard to these and other example, the system 900 can be housed in a single unit or distributed over multiple interconnected units, e.g., through a communication network. The components of the system 900 can accordingly include local and/or remote memory storage devices and any of a wide variety of suitable computer-readable media.

From the foregoing, it will be appreciated that specific embodiments of the technology have been described herein for purposes of illustration, but that various modifications may be made without deviating from the disclosure. Accordingly, the invention is not limited except as by the appended claims. Furthermore, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

I claim:

1. A semiconductor device, comprising:
   a substrate having a front side, a plurality of circuit elements at the front side, and a back side opposite the front side;
   through-substrate vias (TSVs) extending from the front side of the substrate through the substrate;
   conductive material in the TSVs;
   conductive pillars on the front side of the substrate over and electrically coupled to the conductive material in corresponding ones of the TSVs, wherein the conductive pillars have a first height;
   an optical routing layer on the back side of the substrate, wherein the conductive material in at least a portion of the TSVs projects past the back side of the substrate and through the optical routing layer; and
   under bump metallization (UBM) features on the optical routing layer and electrically coupled to the conductive material in corresponding ones of the portion of the TSVs, wherein the UBM features have a second height less than the first height.

2. The semiconductor device of claim 1 wherein the optical routing layer includes at least two passivation materials having different refractive indices.

3. The semiconductor device of claim 2 wherein the at least two passivation materials include a silicon nitride material and a silicon oxide material.

4. The semiconductor device of claim 1 wherein the optical routing layer includes—
   a first layer of a first material having a first refractive index;
   a second layer of a second material having a second refractive index; and
   a third layer of a third material having a third refractive index, wherein the second refractive index is higher than the first and third refractive indices such that optical signals received by the optical routing layer are substantially confined to the second layer.

5. The semiconductor device of claim 4 wherein the first and third materials are the same.

6. The semiconductor device of claim 4 wherein the second layer is patterned to form an optical waveguide.

7. The semiconductor device of claim 6 wherein the second layer is further patterned to form at least one vertical coupling grating optically connected to the optical waveguide.

8. The semiconductor device of claim 1 wherein the circuit elements are memory elements.

9. The semiconductor device of claim 1 wherein the optical routing layer is on substantially the entire back side of the substrate.

10. The semiconductor device of claim 1, further comprising a heater element electrically coupled to the conductive material in at least one of the TSVs, wherein the heater element is configured to heat a portion of the optical routing layer.

11. The semiconductor device of claim 10 wherein the portion of the optical routing layer is an optical switch of the optical routing layer.

12. A semiconductor die package, comprising:
    a semiconductor die including— a substrate having a first surface and a second surface opposite the first surface; through-substrate vias (TSVs) in the substrate, the TSVs including a conductive material extending through the substrate;

an optical routing layer on the second surface, wherein the conductive material of the TSVs projects from the second surface of the substrate and through the optical routing layer;

conductive pillars on the first surface of the substrate over and electrically coupled to corresponding ones of the TSVs, wherein the conductive pillars have a first height; and under bump metallization (UBM) features on the optical routing layer and electrically coupled to corresponding ones of the TSVs, wherein the UBM features have a second height less than the first height;

an active optical component (a) electrically coupled to the conductive material of at least one of the TSVs and (b) optically coupled to the optical routing layer; and an optical fiber optically coupled to the optical routing layer.

13. The semiconductor die package of claim 12 wherein the active optical component is a laser source or a photodiode.

14. The semiconductor die package of claim 12 wherein the optical routing layer includes—
an optical waveguide;
a first vertical coupling grating optically coupling the active optical component to the optical waveguide; and
a second vertical coupling grating optically coupling the optical fiber to the optical waveguide.

15. The semiconductor die package of claim 12 wherein the active optical component is a laser source, and further comprising a photodiode (a) electrically coupled to the conductive material of at least one of the TSVs and (b) optically coupled to the optical routing layer.

16. The semiconductor die package of claim 15 wherein the optical fiber is a first optical fiber, and further comprising a second optical fiber optically coupled to the optical routing layer, wherein the laser source is optically coupled to first optical fiber via the optical routing layer, and wherein the photodiode is optically coupled to the second optical fiber via the optical routing layer.

17. A semiconductor device, comprising:
a substrate having a front side, a plurality of circuit elements at the front side, and a back side opposite the front side;
through-substrate vias (TSVs) extending at least partially through the substrate; conductive material in the TSVs;
an optical routing layer on the back side of the substrate and configured to optically couple with an active optical component exterior to the optical routing layer, wherein the conductive material in at least a portion of the TSVs projects past the back side of the substrate and into the optical routing layer;
conductive pillars on the front side of the substrate over and electrically coupled to the conductive material in corresponding ones of the TSVs, wherein the conductive pillars have a first height; and
under bump metallization (UBM) features on the optical routing layer and electrically coupled to the conductive material in corresponding ones of the portion of the TSVs, wherein the UBM features have a second height less than the first height.

18. The semiconductor device of claim 17, further comprising the active optical component.

19. The semiconductor device of claim 18 wherein the active optical component is an optical transmitter configured to receive electrical signals and convert the electrical signals to optical signals.

20. The semiconductor device of claim 18 wherein the active optical component is an optical receiver configured to receive optical signals and covert the optical signals to electrical signals.

21. The semiconductor device of 17, further comprising an optical fiber optically coupled to the optical routing layer.

22. The semiconductor device of claim 1, wherein the conductive pillars have a height of between about 10-100 µm.

* * * * *